United States Patent
Liao et al.

(10) Patent No.: US 7,639,084 B2
(45) Date of Patent: Dec. 29, 2009

(54) POWER AMPLIFIER WITH NONLINEAR COMPENSATION, AND METHOD THEREOF

(75) Inventors: Che-Hung Liao, Taipei (TW); Jung-Chang Liu, Taipei County (TW); Ying-Che Tseng, Taipei (TW); Did-Min Shih, Milpitas, CA (US)

(73) Assignee: Via Technologies, Inc., Taipei (TW)

( * ) Notice: Subject to any disclaimer, the term of this patent is extended or adjusted under 35 U.S.C. 154(b) by 24 days.

(21) Appl. No.: 11/609,056

(22) Filed: Dec. 11, 2006

(65) Prior Publication Data

US 2008/0136529 A1 Jun. 12, 2008

(51) Int. Cl.
*H03F 3/04* (2006.01)
(52) U.S. Cl. .................................. 330/296; 330/290
(58) Field of Classification Search ............ 330/296, 330/290, 291
See application file for complete search history.

(56) References Cited

U.S. PATENT DOCUMENTS

| | | |
|---|---|---|
| 6,417,735 B1 | 7/2002 | Luo |
| 6,529,080 B1 * | 3/2003 | Seymour et al. ............ 330/296 |
| 6,774,724 B2 * | 8/2004 | Krvavac .................... 330/296 |

FOREIGN PATENT DOCUMENTS

CN 1613178 5/2005

OTHER PUBLICATIONS

CN Office Action mailed Sep. 26, 2008.

* cited by examiner

*Primary Examiner*—Michael B Shingleton
(74) *Attorney, Agent, or Firm*—Thomas, Kayden, Horstemeyer & Risley (57) ABSTRACT

A power amplifier amplifying an input signal is provided, comprising a power amplifier circuit, a bias circuit, and a compensation circuit. The power amplifier circuit has an input impedance responsive to the input signal, and amplifies the input signal to generate an output signal. The bias circuit is coupled to the power amplifier circuit, generates a DC bias signal to the power amplifier so that the power amplifier amplifies the input signal. The compensation circuit is coupled to the power amplifier circuit, provides a compensation impedance responsive to the input signal such that a combination of the input impedance and the compensation impedance is substantially constant regardless of the input signal.

2 Claims, 7 Drawing Sheets

POWER AMPLIFIER WITH NONLINEAR COMPENSATION, AND METHOD THEREOF

BACKGROUND OF THE INVENTION

1. Field of the Invention

The invention relates to a power amplifier, and in particular to a power amplifier with a compensation circuit.

2. Description of the Related Art

A power amplifier amplifies an input signal by a gain at a transmitter prior to data transmission. A power amplifier is considered linear if an output of the amplifier is only different from the input by a substantially constant gain, which is a ratio of output to input signals. Linear power amplifiers find wide applications in RF (Radio Frequency) systems by preventing distortion in the output signal.

Nonlinearity in a power amplifier is caused by nonlinear transconductance (output current gain per change in input voltage), nonlinear input capacitance and nonlinear output resistance. Nonlinear transconductance of the power amplifier is controlled by utilizing the operation range of output power within a satisfactory range of gain, referred to as P1 dB point. Nonlinear output resistance is resolved by high output resistance. Nonlinear input capacitance arises from input capacitance of a power amplifying transistor in a power amplifier being a function of an input signal. In the case of MOS transistor technology, the gate-source capacitance varies with the gate voltage, and in Bipolar transistor technology, the base-emitter capacitance also changes with the base voltage.

Power efficiency is another important measure of a power amplifier because a large current and power is consumed during power amplification. In cases of mobile applications, power efficiency of a power amplifier is critical to determine battery life of mobile devices.

The capability for a power amplifier circuit to maintain efficiency over a wide range of power output levels is referred to as backoff range. Loss of power amplifier efficiency under dynamic backoff conditions can be especially problematic when the power resource is scarce, thus power amplifier for wireless or satellite communication devices typically desire high power efficiency and wider backoff range.

Thus there is a need to provide a linear, high efficiency power amplifier.

BRIEF SUMMARY OF THE INVENTION

A detailed description is given in the following embodiments with reference to the accompanying drawings.

According to the invention, a power amplifier amplifying an input signal is provided, comprising a power amplifier circuit, a bias circuit, and a compensation circuit. The power amplifier circuit has an input impedance responsive to the input signal, and amplifies the input signal to generate an output signal. The bias circuit is coupled to the power amplifier circuit, generates a DC bias signal to the power amplifier so that the power amplifier amplifies the input signal. The compensation circuit is coupled to the power amplifier circuit, provides a compensation impedance responsive to the input signal such that a combination of the input impedance and the compensation impedance is substantially constant regardless of the input signal.

According to another embodiment of the invention, a power amplifier amplifying an input signal is also provided, comprising a power amplifier circuit, and a bias and compensation circuit. The power amplifier circuit has a first transistor of a first type, amplifying the input signal. The bias and compensation circuit having a second transistor of a second type, coupled to the first transistor, generating a DC bias signal to the power amplifier so that the first transistor amplifies the input signal, providing a compensation impedance responsive to the input signal such that a combination of the input impedance and the compensation impedance is substantially constant regardless of the input signal.

According to another embodiment of the invention, a method of amplifying an input signal is disclosed, comprising providing an input impedance responsive to the input signal, by a power amplifier circuit amplifying the input signal to generate an output signal; generating a DC bias signal to the power amplifier so that the power amplifier amplifies the input signal; and providing a compensation impedance responsive to the input signal, by a compensation circuit, such that a combination of the input impedance and the compensation impedance is substantially constant regardless of the input signal.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
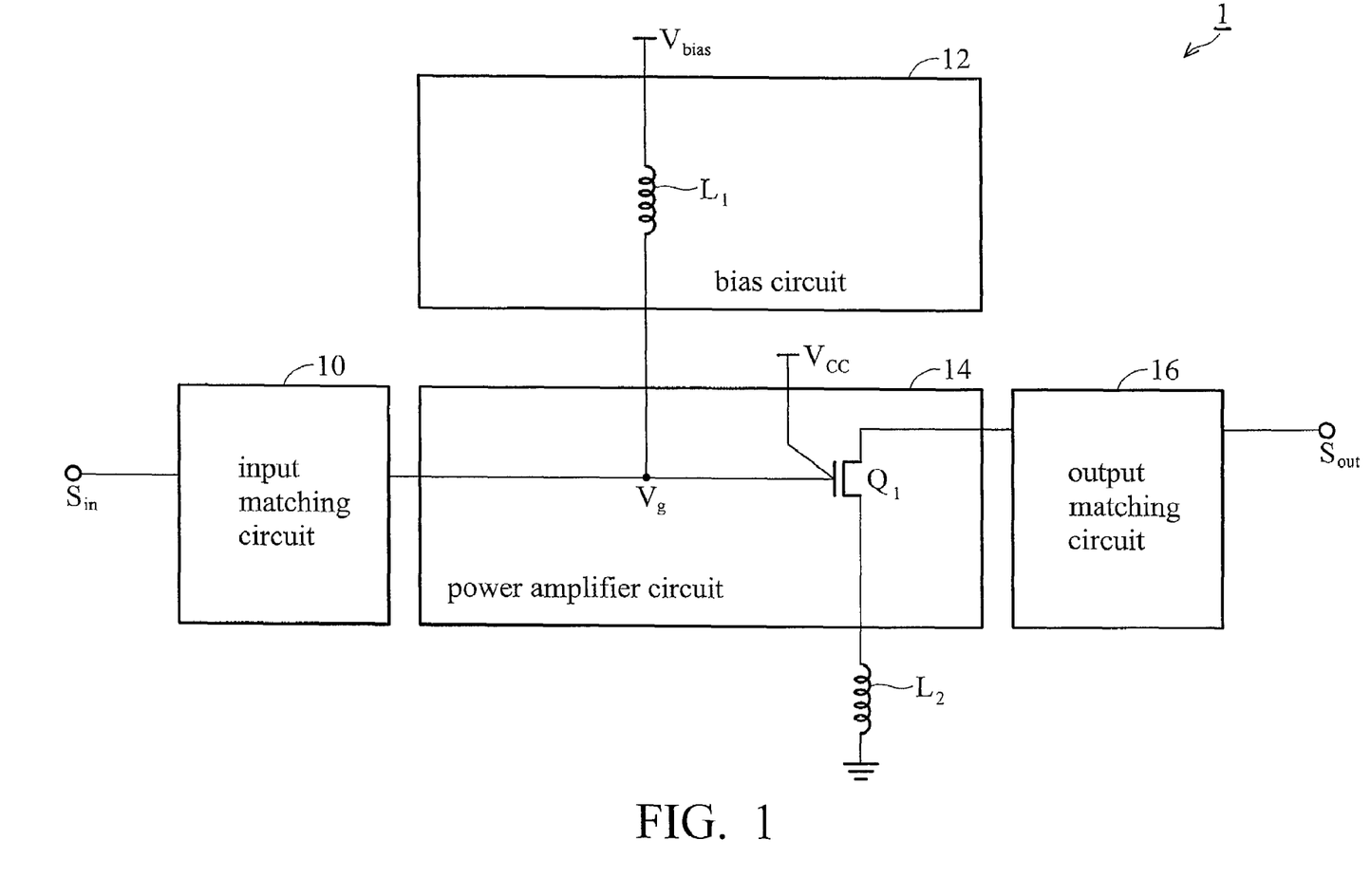
FIG. 1 is a block diagram of a conventional power amplifier.

FIG. 1 is a block diagram of a conventional power amplifier, comprising input matching circuit 10, bias circuit 12, power amplifier circuit 14, and output matching circuit 16. Input matching circuit 10 and bias circuit 12 are coupled to power amplifier circuit 14, and then to output matching circuit 16.

Power amplifier circuit 14 includes power amplifier transistor Q1 biased by a bias voltage from bias circuit 12 such that input signal $S_{in}$ is amplified by gain G. RF chock L1 in bias circuit 12 is coupled between voltage $V_{bias}$ and gate of transistor Q1 to provide the bias voltage, allowing input signal $S_{in}$ swinging at average DC (direct current) level of the bias voltage. Input matching circuit 10 and output matching circuit 16 match desirable input and output impedance respectively. As input signal $S_{in}$ swings at different voltage level, the gate to source capacitance exhibits nonlinear variation, and distorts the desirable waveform of output signal $S_{out}$.

Figure 2:
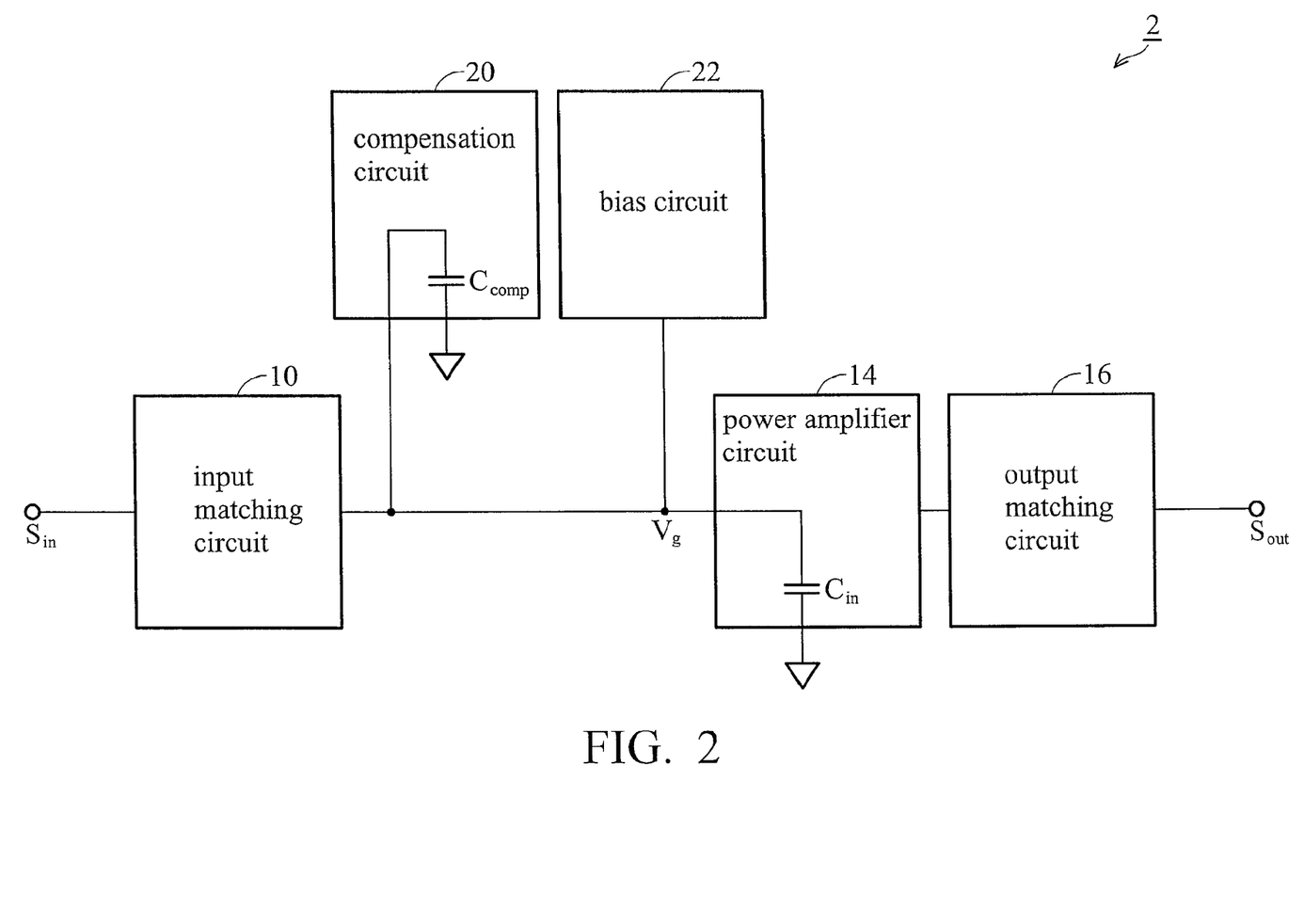
FIG. 2 is a block diagram of an exemplary power amplifier according to the invention.

FIG. 2 is a block diagram of an exemplary power amplifier according to the invention, comprising input matching circuit 10, compensation circuit 20, bias circuit 22, power amplifier circuit 14, and output matching circuit 16. Input matching circuit 10, compensation circuit 20, and bias circuit 22 are coupled to power amplifier circuit 14, and subsequently to output matching circuit 16.

Bias circuit 22 provides a bias voltage to bias power amplifier circuit 14 having input impedance $C_{in}$ varying with input signal $S_{in}$, which contributes to signal distortion at output signal $S_{out}$. Compensation circuit 20 provides a compensation capacitance $C_{comp}$ compensating for the nonlinear variation of input impedance $C_{in}$, such that a combination of input impedance $C_{in}$ and compensation impedance $C_{comp}$ remains substantially constant, regardless of the swing of input signal $S_{in}$. For example, when input signal $S_{in}$ swings to a higher voltage level, input impedance $C_{in}$ increases and compensation impedance $C_{comp}$ decreases correspondingly, resulting in a substantially constant overall capacitance ($=C_{in}+C_{comp}$), and eliminating signal distortion of output signal $S_{out}$ due to nonlinear input impedance.

Figure 3:
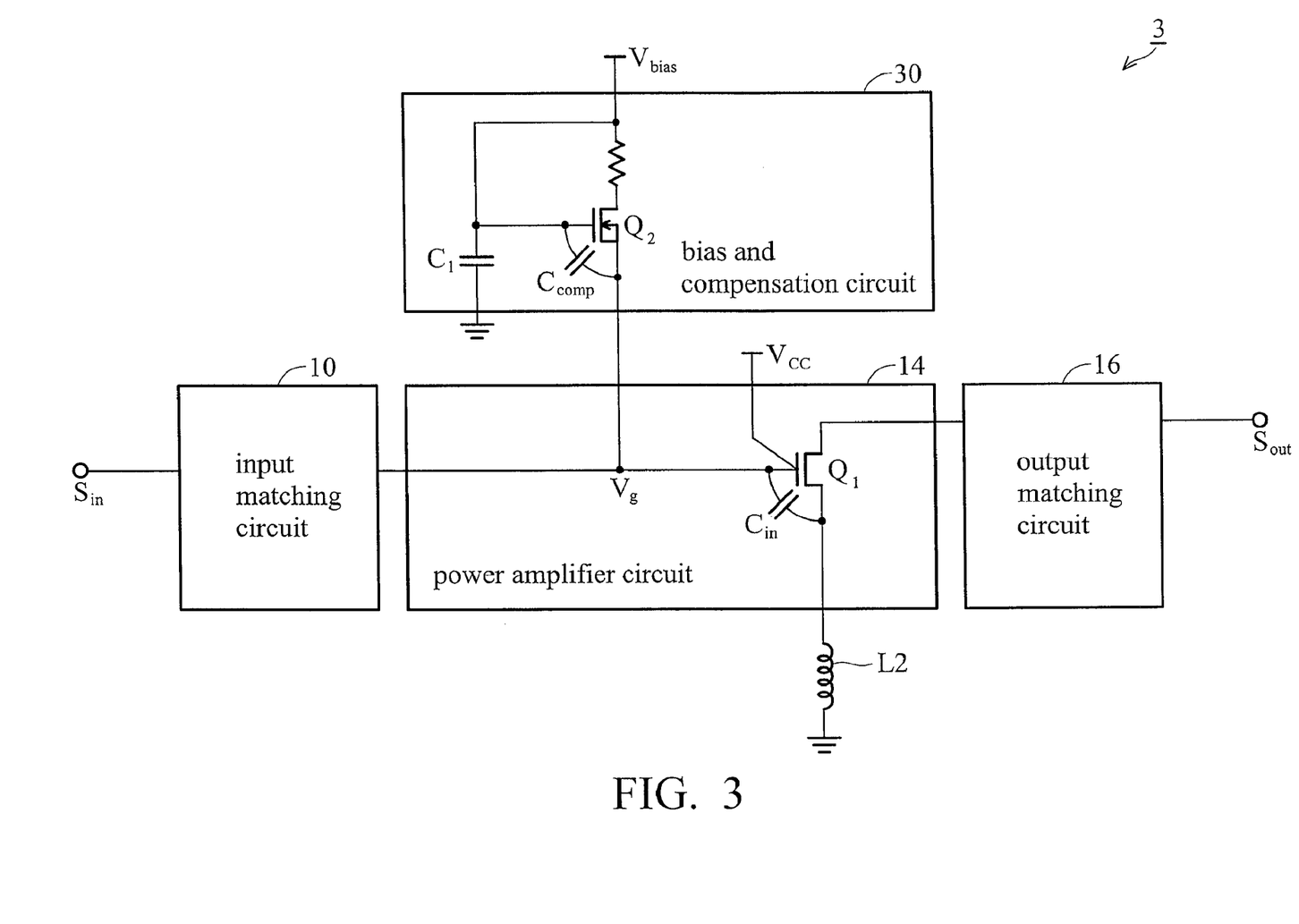
FIG. 3 is a detailed circuit schematic diagram of the exemplary power amplifier according to the invention.

FIG. 3 is a detailed circuit schematic diagram of the exemplary power amplifier according to the invention, comprising input matching circuit 10, bias and compensation circuit 30, power amplifier circuit 14, and output matching circuit 16. Input matching circuit 10 and bias and compensation circuit 30 are coupled to power amplifier circuit 14, and subsequently to output matching circuit 16.

Bias and compensation circuit 30 provides bias and input capacitance compensation functionalities, as disclosed in compensation circuit 20 and bias circuit 22 in FIG. 2, and comprises transistor $Q_2$ connected in diode configuration, and ground capacitor $C_1$ connecting between the gate of transistor $Q_2$ and ground. Transistor $Q_2$ may be a PMOS transistor providing compensation capacitance $C_{comp}$ responsive to input signal $S_{in}$ between the drain and gate terminals thereof. The diode connection of transistor $Q_2$ acts as a rectifier, taking input signal $S_{in}$ to the input of the diode through compensation capacitance $C_{comp}$, so that a bias voltage supplied to power amplifier circuit 14 increases with the voltage swing of input signal $S_{in}$. Input signal $S_{in}$ may be an RF signal.

Power amplifier 14 includes power amplifying transistor $Q_1$ biased by the bias voltage. Power amplifying transistor $Q_1$ is selected to be a complementary transistor type of transistor $Q_2$, and may be an NMOS transistor with input impedance $C_{in}$ responsive to input signal $S_{in}$, so that when input signal $S_{in}$ changes in voltage level, transistor Q2 produces compensation impedance $C_{comp}$ complementary to input impedance $C_{in}$, thus eliminating nonlinear input impedance characteristic and signal distortion of output signal $S_{out}$ in power amplifier 3.

While MOS technology is implemented in exemplary power amplifier 3, people in the art may adapt the invention as appropriate to bipolar or other processes.

Figure 4:
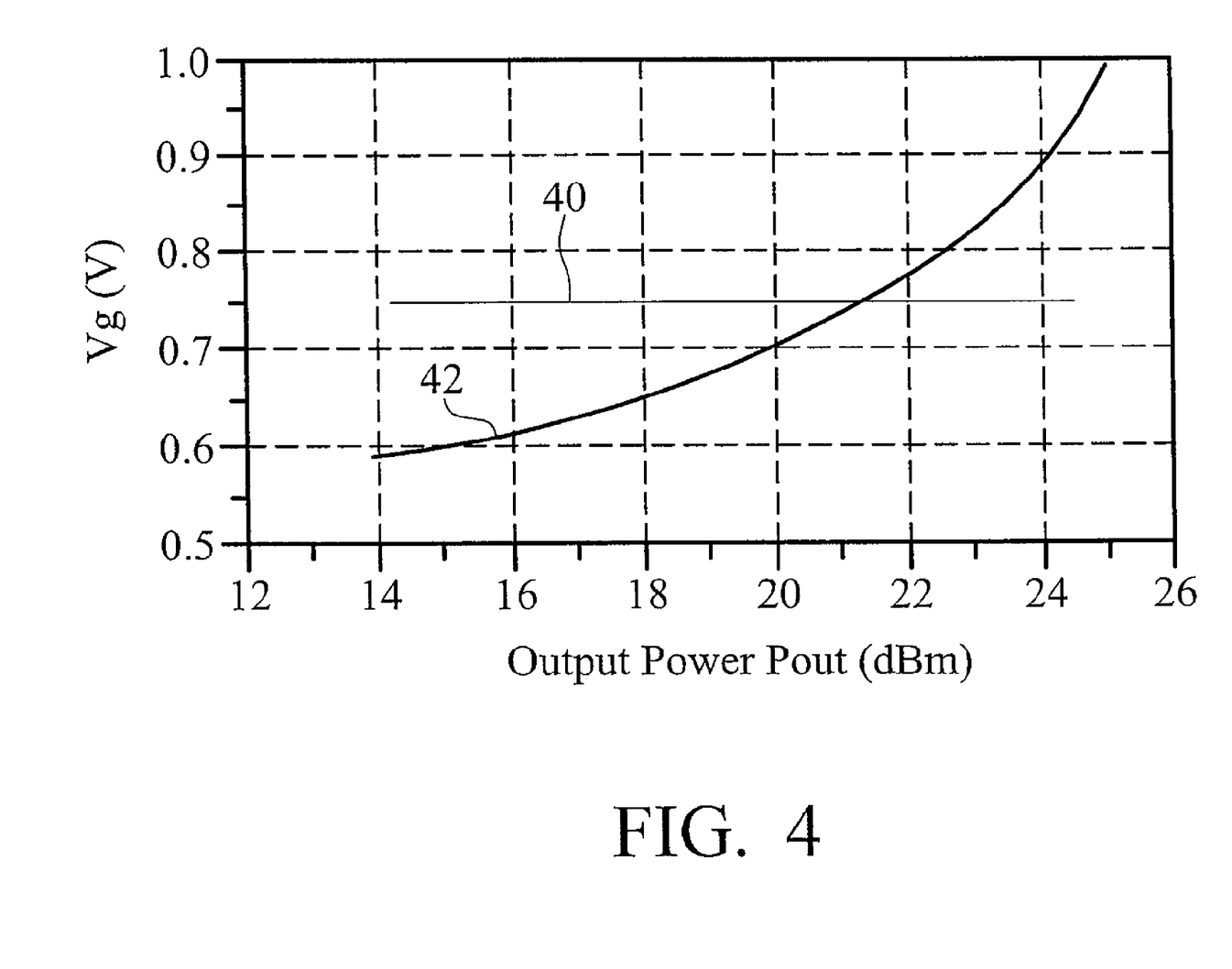
FIG. 4 is a simulation plot of gate voltage $V_g$ of power amplifier circuit 14 against output power $P_{out}$.

FIG. 4 is a simulation plot of gate voltage $V_g$ of power amplifier circuit 14 against output power $P_{out}$, incorporating conventional power amplifier 1 in FIG. 1 and power amplifier 3 in FIG. 3, comprising plot 40 for conventional power amplifier 1 and plot 42 for power amplifier 3. Output power $P_{out}$ is measured in dBm and gate voltage $V_g$ is measured in volt.

As depicted in FIG. 4, conventional power amplifier 1 employs a constant bias voltage at node $V_g$, and output power $P_{out}$ increases with the swing of input signal $S_{in}$. Power amplifier 3 has an increasing bias voltage dependent on the swing of input signal $S_{in}$, driving an increment in output power $P_{out}$.

Figure 5:
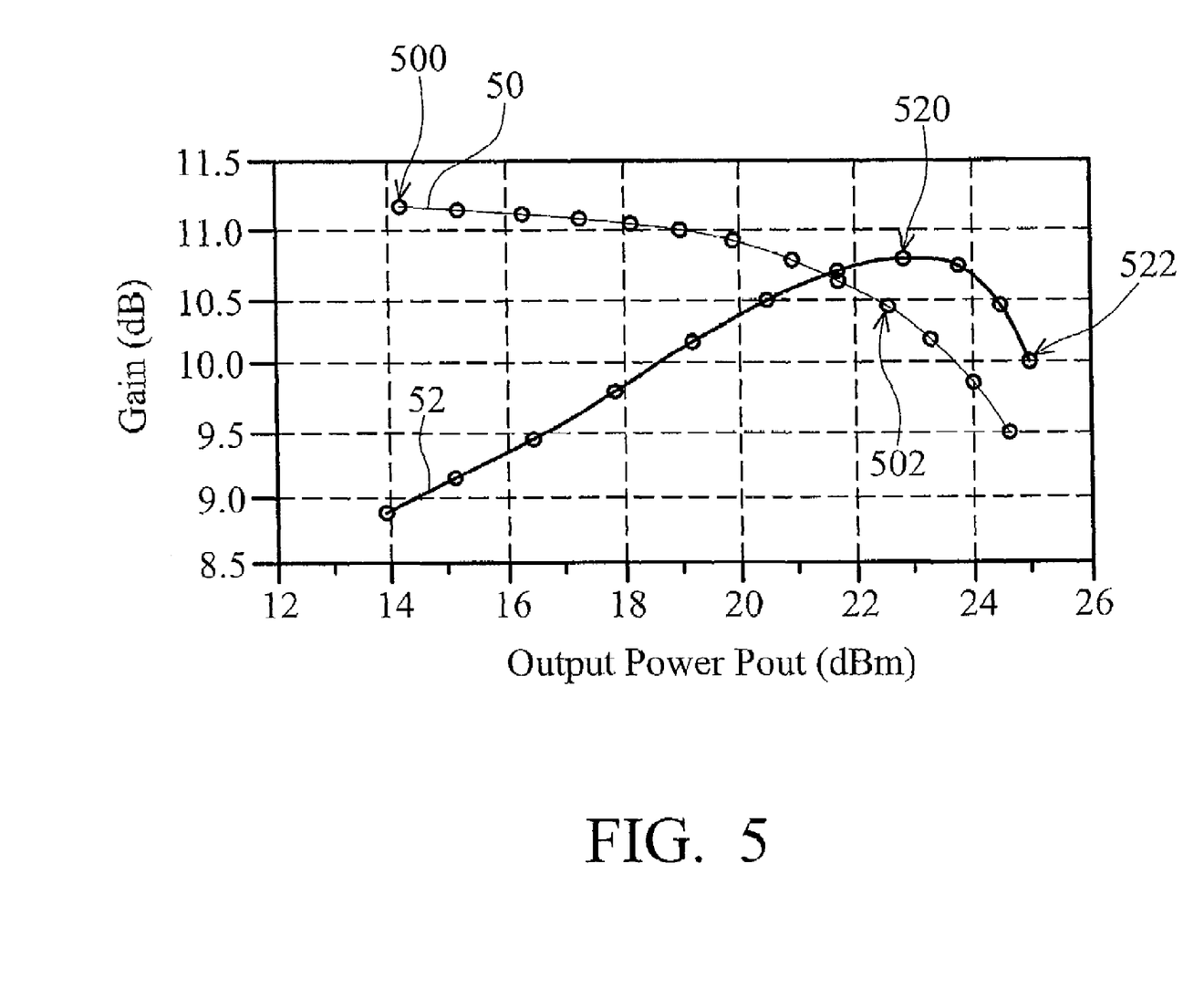
FIG. 5 is a simulation plot of gain G of power amplifier circuit 14 against output power $P_{out}$.

FIG. 5 is a simulation plot of gain G of power amplifier circuit 14 against output power $P_{out}$, incorporating conventional power amplifier 1 in FIG. 1 and power amplifier 3 in FIG. 3, comprising plot 50 for conventional power amplifier 1 and plot 52 for power amplifier 3. Output power $P_{out}$ is measured in dBm and gain G is measured in dB.

Referring to FIG. 5, conventional power amplifier 1 (plot 50) has a peak gain at node 500 and P1 dB point at node 502, power amplifier 3 (plot 52) has a peak gain at node 520 and P1 dB point at node 522, thus the P1 dB point of power amplifier 3 (25 dB) exceeds that of conventional power amplifier 1 (22.5 dB) by more than 2 dB. Recall that the P1 dB point is a measure of gain compression and linearity of a power amplifier, a power amplifier having a higher P1 dB point indicates wider backoff range and less distortion in the output signal. Therefore power amplifier 3 has better linearity and power efficiency than conventional power amplifier 1.

Figure 6:
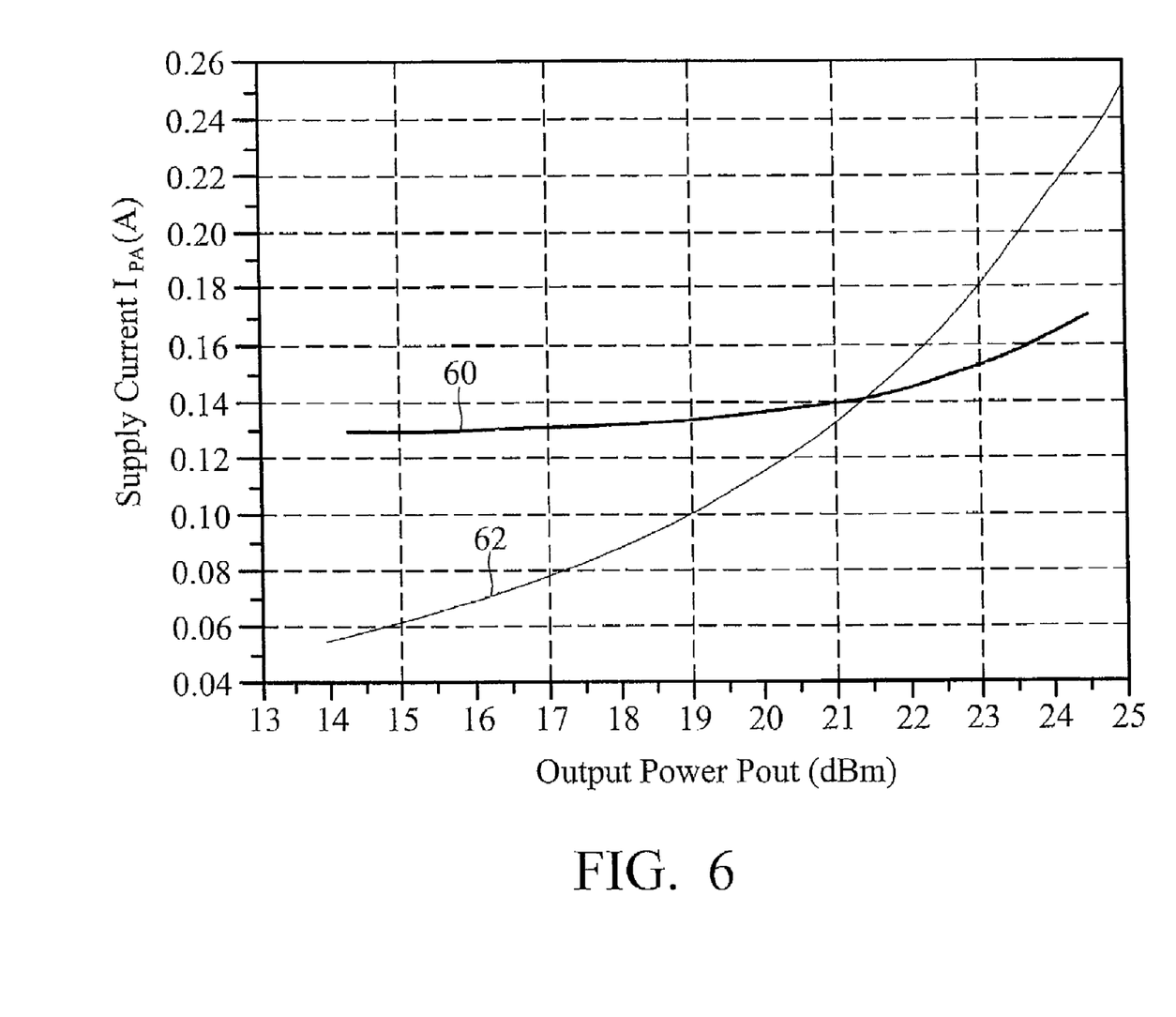
FIG. 6 is a simulation plot of supply current $I_{PA}$ of power amplifier circuit 14 against output power $P_{out}$.

FIG. 6 is a simulation plot of supply current $I_{PA}$ of power amplifier circuit 14 against output power $P_{out}$, incorporating conventional power amplifier 1 in FIG. 1 and power amplifier 3 in FIG. 3, comprising plot 60 for conventional power amplifier 1 and plot 62 for power amplifier 3. Output power $P_{out}$ is measured in dBm and supply current $I_{PA}$ is measured in ampere.

Referring to FIG. 6, conventional power amplifier 1 (plot 60) has constant supply current $I_{PA}$, owing to the constant bias voltage $V_g$ (as depicted in FIG. 4). Power amplifier 3 (plot 62) has increasing supply current $I_{PA}$ corresponding to the increasing bias voltage $V_g$ in FIG. 4, and is lower at lower output power $P_{out}$ comparing to conventional power amplifier 1. Consequently power amplifier 3 requires less amplifier power at lower output power than conventional power amplifier 1.

Figure 7:
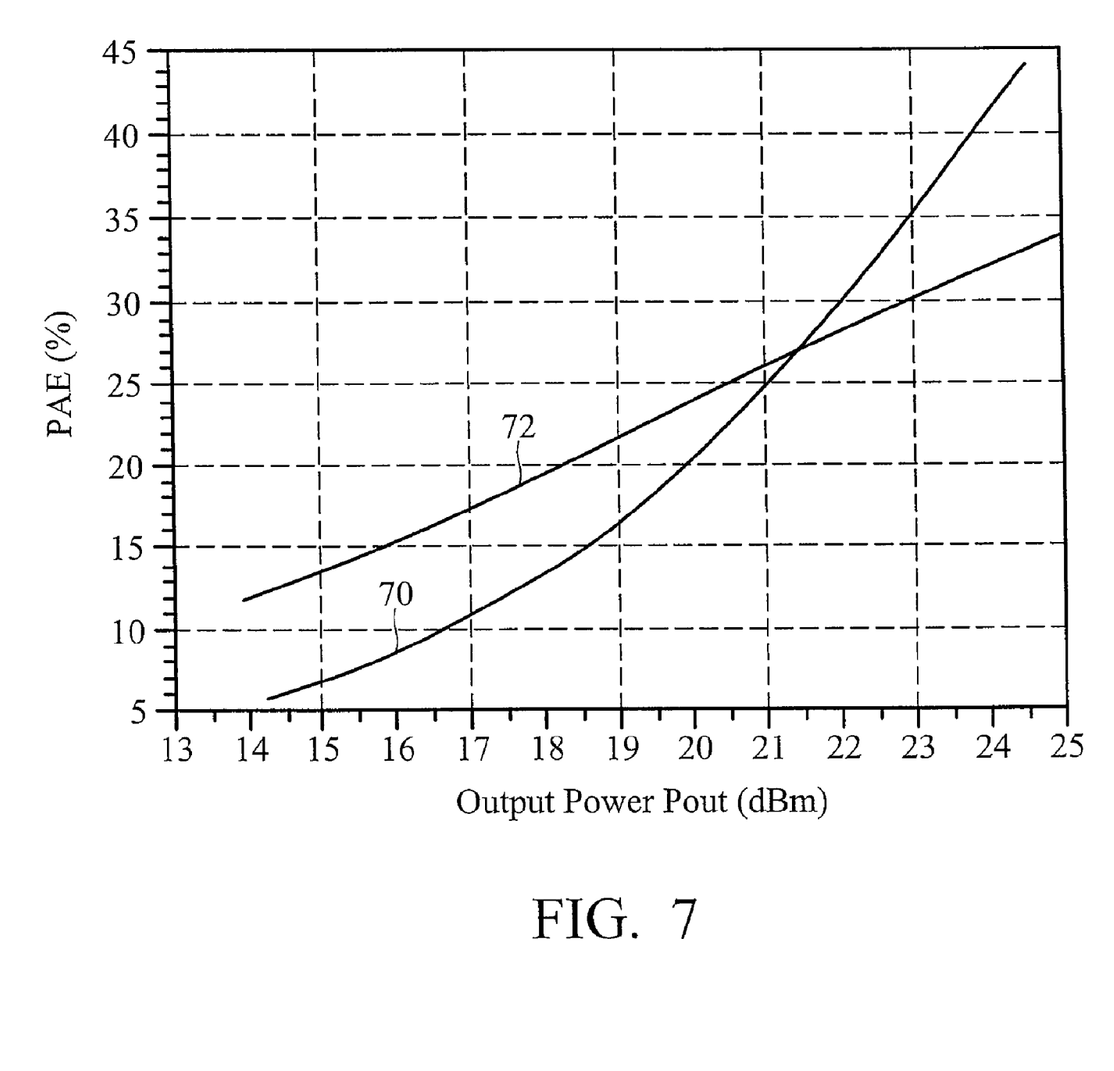
FIG. 7 is a simulation plot of power added efficiency (PAE) of power amplifier circuit 14 against output power $P_{out}$.

FIG. 7 is a simulation plot of power added efficiency (PAE) of power amplifier circuit 14 against output power $P_{out}$, incorporating conventional power amplifier 1 in FIG. 1 and power amplifier 3 in FIG. 3, comprising plot 70 for conventional power amplifier 1 and plot 72 for power amplifier 3. Output power $P_{out}$ is measured in dBm and power added efficiency PAE is measured in percentage.

Power added efficiency PAE is expressed by equation 1:

$$PAE(\%)=(P_{out}-P_{in})*100/\text{amplifier power} \qquad (1)$$

Where $P_{out}$ is the output power of power amplifier circuit 14 in mW;

$P_{in}$ is the input power of power amplifier circuit 14 in mW; and amplifier power is power consumption of power amplifier circuit 14 in mW Referring to FIG. 7, conventional power amplifier 1 (plot 70) has constant supply current $I_{PA}$, owing to the constant bias voltage $V_g$ (as depicted in FIG. 4). Conventional power amplifier 1 (plot 70) shows an exponential increment in PAE with output power $P_{out}$, while power amplifier 3 (plot 72) shows a linear increment in PAE with output power $P_{out}$. Plot 72 (power amplifier 3) displays a better PAE than plot 70 (conventional power amplifier 1) for output power $P_{out}$ less than 21 dBm, which is within the range of the interest (14~18 dBm) for wireless transmission applications.

A method of amplifying an input signal is also disclosed in the invention, incorporating power amplifier 3 in FIG. 3. The method comprises providing input impedance $C_{in}$ responsive to input signal $S_{in}$, by power amplifier circuit 14 amplifying input signal $S_{in}$ to generate output signal $S_{out}$; generating DC bias signal $V_g$ to power amplifier circuit 14 to amplify input signal $S_{in}$; and providing compensation impedance $C_{comp}$ responsive to input signal $S_{in}$, by bias and compensation circuit 30, such that a combination of input impedance $C_{in}$ and compensation impedance $C_{comp}$ is substantially constant regardless of input signal $S_{in}$.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded to the broadest interpretation so as to encompass all such modifications and similar arrangements.

What is claimed is:

1. A power amplifier amplifying an input signal, comprising:
   a power amplifier circuit having a first transistor of a first type, amplifying the input signal;
   a bias and compensation circuit having a second transistor of a second type, coupled to the first transistor, generating a DC bias signal to the power amplifier so that the first transistor amplifies the input signal, providing a compensation impedance responsive to the input signal such that a combination of the input impedance and the compensation impedance is substantially constant regardless of the input signal, wherein the first type is different from the second type, the first transistor of the first type is a NMOS transistor, and the second transistor of the second type is a PMOS transistor; the first transistor comprises a first gate receiving the input signal, a first drain coupled to a signal output terminal for outputting the amplified input signal, and a first source coupled to a ground; and the second transistor comprises a second gate coupled to the ground, a second source coupled to the second gate, and a second drain directly connected to the first gate.

2. The power amplifier of claim 1, wherein the bias and compensation circuit further comprises:
   a resistor comprising a first terminal coupled to a voltage source and a second terminal coupled to an input terminal of the second transistor; and
   a capacitor comprising a third terminal coupled to the first terminal of the resistor and a control terminal of the second transistor, and a fourth terminal grounded.

* * * * *